United States Patent

Rösel et al.

[11] Patent Number: 5,198,391
[45] Date of Patent: Mar. 30, 1993

[54] METHOD FOR BONDING LLCCC-COMPONENTS USING A LEADFRAME

[75] Inventors: Helmut Rösel, Holzkirchen; Martin Eck, Egmating, both of Fed. Rep. of Germany

[73] Assignee: Deutsche Aerospace AG, Fed. Rep. of Germany

[21] Appl. No.: 897,933

[22] Filed: Jun. 15, 1992

[30] Foreign Application Priority Data

Jun. 15, 1991 [DE] Fed. Rep. of Germany ....... 4119741

[51] Int. Cl.$^5$ ............... H01L 21/58; H01L 21/60
[52] U.S. Cl. ................................ 437/218; 437/270
[58] Field of Search ................ 437/217, 220, 218

[56] References Cited

U.S. PATENT DOCUMENTS

| 3,906,621 | 9/1975 | Epple | 437/220 |
| 4,189,085 | 2/1980 | Penrod | 437/220 |
| 4,751,199 | 6/1988 | Phy | 437/209 |

FOREIGN PATENT DOCUMENTS 0216363 9/1986 European Pat. Off. .

OTHER PUBLICATIONS

Elektkonik Industrie-Eine neue LSI-Sehäuse-Norm Daniell. Amey-pp. 18-20, 1977.

Primary Examiner—Olik Chaudhuri
Assistant Examiner—David E. Graybill
Attorney, Agent, or Firm—Evenson, Wands, Edwards, Lenahan & McKeown

[57] ABSTRACT

A method for electrically bonding surface-mountable integrated circuits (LLCCC-components) onto a printed circuit board. A specially shaped flexible bonding element having a semicircular central portion is used to flexibly connect the LLCCC components to the circuit board so that stresses due to thermal expansion of the components are absorbed.

7 Claims, 2 Drawing Sheets

METHOD FOR BONDING LLCCC-COMPONENTS USING A LEADFRAME

BACKGROUND AND SUMMARY OF THE INVENTION

This invention relates to a method for electrical bonding of LLCCC-components on printed circuit boards.

The use of LLCCC (Leadless Ceramic Chip Carrier) components in space technology has so far been possible only on ceramic substrates or special substrates with adapted coefficients of expansion, due to the very different physical characteristics of the component and the printed circuit board. These surface-mountable integrated circuits are situated in a hermetically sealed ceramic housing, and no longer have any flexible connections; thus, the multiple bonding—up to 68 connections—to the ceramic substrate must be established by way of soldering surfaces. FIG. 1 of the drawing illustrates a standard bonding for LLCCC-components according to the state of the art. This bonding technique, however, is not sufficiently reliable for the use of such components on printed circuit boards in space technology because the stress resulting from temperature changes encountered in such applications causes excessive expansion problems.

It is an object of the invention to provide a bonding method which permits the use of LLCCC-components in electronic systems for space applications, and which reliably accommodates the high temperature stress which occurs on these components in a space environment.

This object is achieved by the use of specially shaped flexible bonding elements to secure the LLCCC component to the printed circuit board. In a preferred embodiment, the bonding elements are bent to a semicircular curvature which provides the flexibility necessary to absorb stresses due to differing coefficients of thermal expansion among the various components.

Other objects, advantages and novel features of the present invention will become apparent from the following detailed description of the invention when considered in conjunction with the accompanying drawings.

DETAILED DESCRIPTION OF THE DRAWINGS

Figure 1:
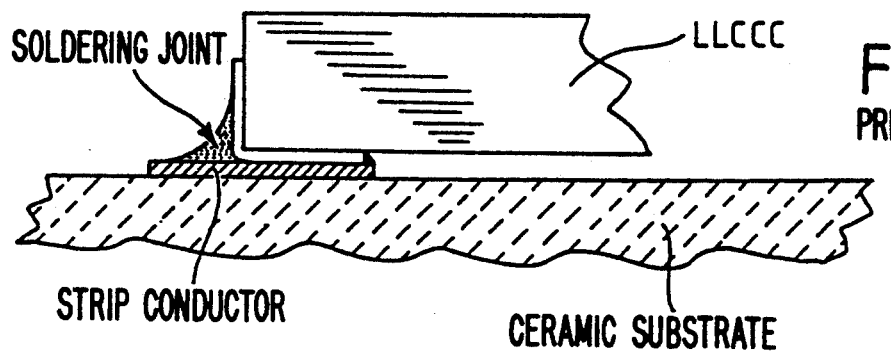
FIG. 1 is a schematic diagram of a prior art bonding arrangement for LLCCC-components.

At present, epoxy-fiberglass sheets are used as the base material for printed circuit boards in space technology FIG. 1 is a cross sectional view of such a bonding arrangement according to the prior art. As is apparent, if the respective components have different coefficients of thermal expansion, any substantial change in the ambient operating temperature will give rise to stresses at the soldering joint which in the long run will result in an unacceptable failure rate.

Figure 3:
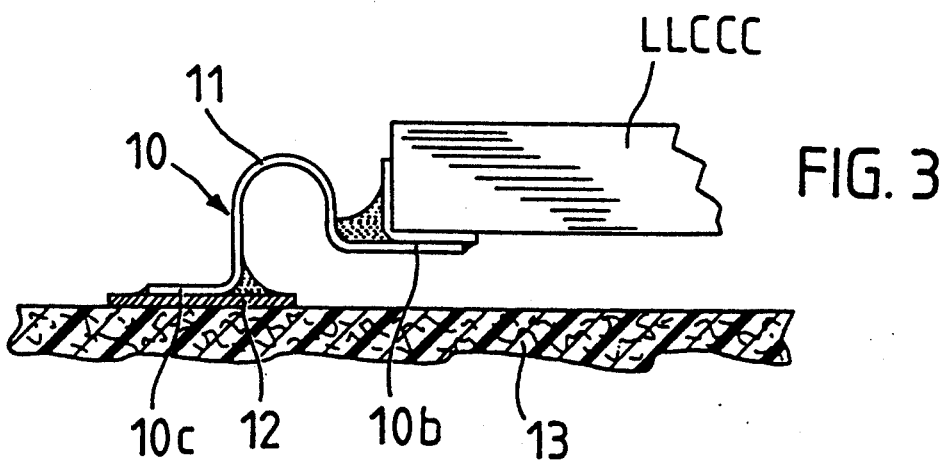
FIG. 3 is a schematic diagram (cross-section) of the suggested bonding technique for LLCCC-components for use in space technology, according to the invention.

This problem is resolved simply and effectively by the mounting technique according to the invention, which is illustrated in partial cross section in FIG. 3. As can be seen, the LLCCC element is held in place by bonding elements 10 which are soldered to the LLCCC element at one end 10b and to a strip conductor 12 mounted on the printed circuit board 13 at the other end 10c. in order to allow for the absorption of stresses due to thermal expansion properties of the respective components, the bonding element 10 are bent in a semi-circular configuration at 11.

Figure 4:
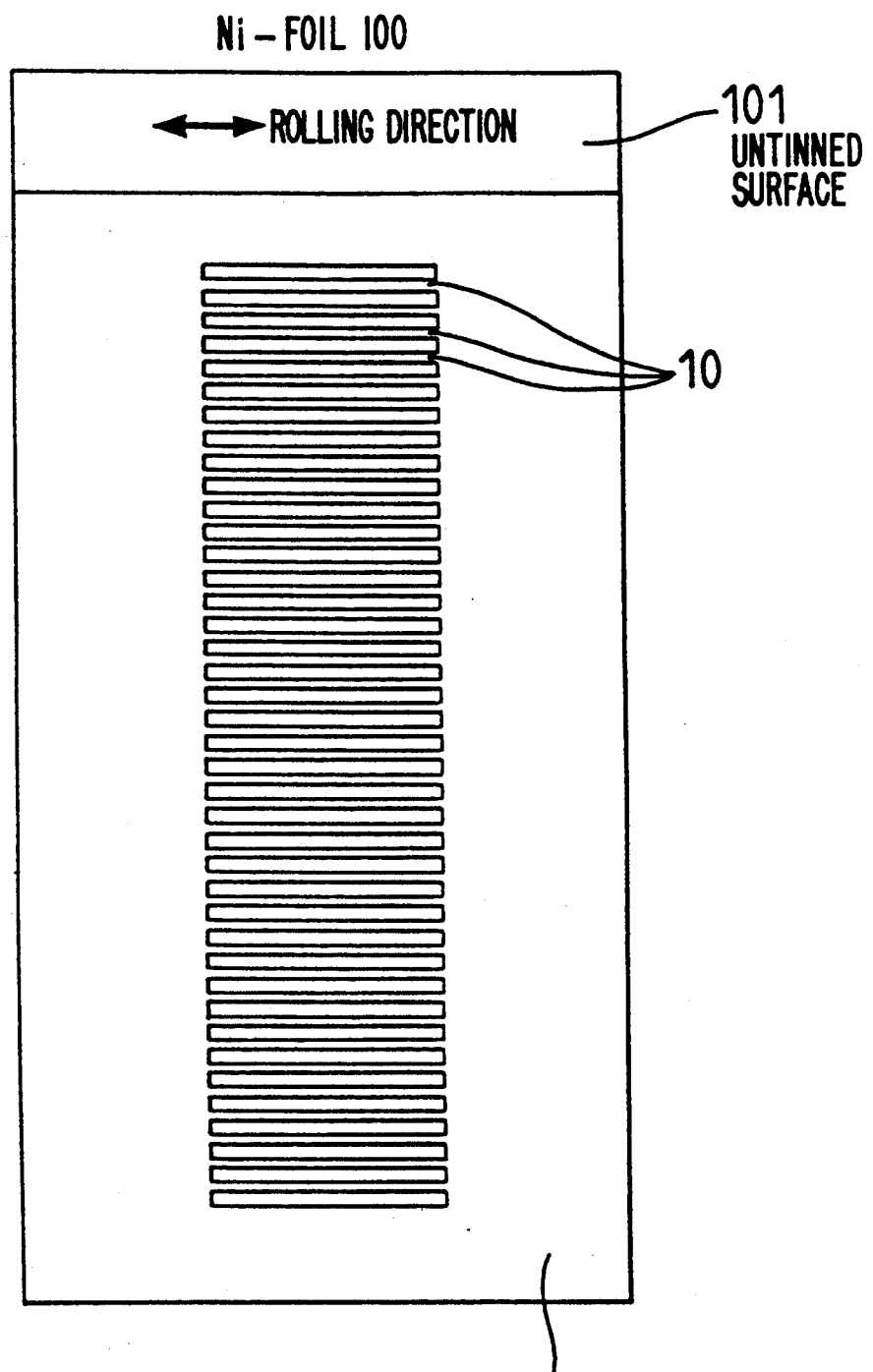
FIG. 4 is a view of a Ni-foil with the bonding elements after the electrotinning.

The bonding elements 10 are etched out of a sheet of nickel foil (Ni-foil) 100 which is electrotinned on both sides to an extent of 10 to 15 $\mu$m by means of Sn60Pb. As shown in FIG. 4, an edge strip 101 of the foil 100 is not electrotinned, in order to permit measurement of the effective tinning extent on it, and to permit determination of the rolling direction.

Figure 2:
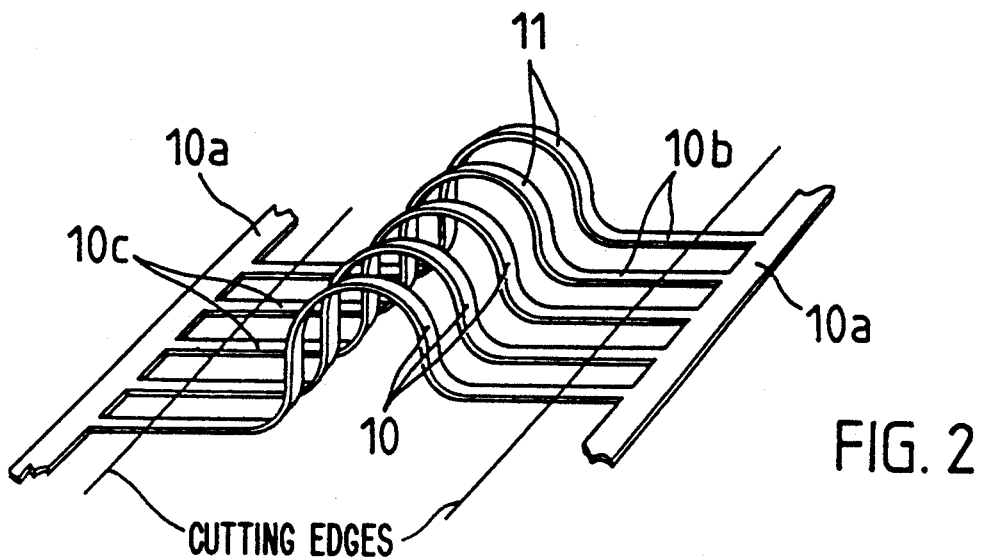
FIG. 2 is a perspective view of a section of etched-out bonding elements according to the invention.

Subsequently, the bonding elements are provided with a semicircular curvature or bending 11 in their center area, as shown in FIG. 2. As with all other dimensions in the drawing, the radius of this bending 11 is enlarged in the illustration. In reality, the radius in this case amounts to, for example, 0.5 mm. After this bending is established, the bonding elements are cut to length on one side; that is, one of the cross webs 10a—as shown—is cut off at the point determined by the desired element length.

The bonding elements 10, which on one side are still connected with one another by means of the other cross web 10a, are individually soldered together with the LLCCC-component. After this soldering-together, the other cross web 10a is then cut off at the required web length, and the free ends of the bonding elements 10, which are now fixed in their position on the LLCCC-component by means of the preceding soldering, are soldered to the strip conductor 12 of the printed circuit board 13, and the electrical bonding is therefore established between the component and the printed circuit board.

By means of this method, the previous expansion problems caused by the stress of changing temperatures in travel are eliminated, and thus the use of LLCCC-components is permitted in space technology. However, the suggested method also offers other advantages, particularly a good visual control of the soldering joints. Furthermore, the soldered-on components can be exchanged easily and absolutely without any problems. In the case of vibrations and stress caused by temperature changes, the soldering joints must absorb virtually no more special stress; and finally, this method also significantly expands the application spectrum of highly integrated printed circuit boards.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. A method for electrically bonding a chip carrier component to a printed circuit board by way of bonding elements, said method comprising the steps of:
   providing a sheet of foil tinned on both sides thereof, and having a width corresponding to a length of said bonding elements;
   forming said bonding elements from said foil sheet by etching a plurality of transverse slots therein, while maintaining first and second cross webs connecting said bonding elements at extremities thereof, along opposite edges of said foil sheet;

bending said bonding element in a semicircular shape at a longitudinally central portion thereof;

severing said first cross web from said bonding elements;

soldering free ends of said bonding elements to the chip carrier component;

severing said second cross web from said bonding elements, and soldering severed ends of said bonding elements to a strip conductor of said printed circuit board, thereby effecting mechanical and electrical bonding of said leadless ceramic chip carrier component to said circuit board.

2. Method according to claim 1, wherein said chip carrier component is a leadless ceramic chip carrier component.

3. Method according to claim 1, wherein said foil is Ni-foil.

4. A method according to claim 3, wherein the foil is tinned to the extent of 10 to 15 μm on both sides by means of Sn60Pb, and is recast.

5. A method according to claim 1, wherein the foil has an edge strip which is excluded from the tinning.

6. A method according to claim 2, wherein the foil has an edge strip which is excluded from the tinning.

7. A method according to claim 4, wherein the foil has an edge strip which is excluded from the tinning.

* * * * *